United States Patent [19]

Davis et al.

[11] 4,125,855
[45] Nov. 14, 1978

[54] INTEGRATED SEMICONDUCTOR CROSSPOINT ARRANGEMENT

[75] Inventors: James A. Davis, Glen Ellyn; William J. Ooms, Schaumburg, both of Ill.

[73] Assignee: Bell Telephone Laboratories, Incorporated, Murray Hill, N.J.

[21] Appl. No.: 781,790

[22] Filed: Mar. 28, 1977

[51] Int. Cl.$^2$ .............................................. H01L 27/04
[52] U.S. Cl. ........................................ 357/45; 357/35; 357/36; 357/44; 357/48
[58] Field of Search ..................... 357/35, 36, 34, 46, 357/92, 45, 48, 44

[56] References Cited

U.S. PATENT DOCUMENTS 3,891,480   6/1975   Fulkerson .......................... 357/48 X Primary Examiner—Martin H. Edlow
Assistant Examiner—James W. Davie
Attorney, Agent, or Firm—John C. Albrecht; Arthur J. Torsiglieri

[57] ABSTRACT

Symmetrical integrated transistors and drive circuitry provide low loss bilateral analog crosspoints for a switching matrix. Each crosspoint comprises a high performance PNP lateral transmission switching transistor and an associated NPN vertical drive transistor formed over a common n-type buried tub in a p-type substrate. Individual crosspoints, including the transmission transistor and the drive circuitry, are isolated by means of frame shaped p-type isolation regions lying outside the buried tub. The collector of the NPN drive transistor and the base of the PNP transmission transistor are ohmically connected by means of the buried tub. Accordingly, although the transmission transistor and the drive transistor are merged in a single isolation region, current drive to the PNP transistor is by means of the NPN transistor as a functionally independent device. The lateral PNP transistor comprises stripe shaped emitter and collector electrodes which are formed in a single step with the isolation region and the electrodes are of equal doping, size, and shape. Pluralities of such emitters and collectors which are respectively interconnected by surface metallizations may be utilized to increase the efficiency and the current carrying capacity of the transmission transistor.

5 Claims, 7 Drawing Figures

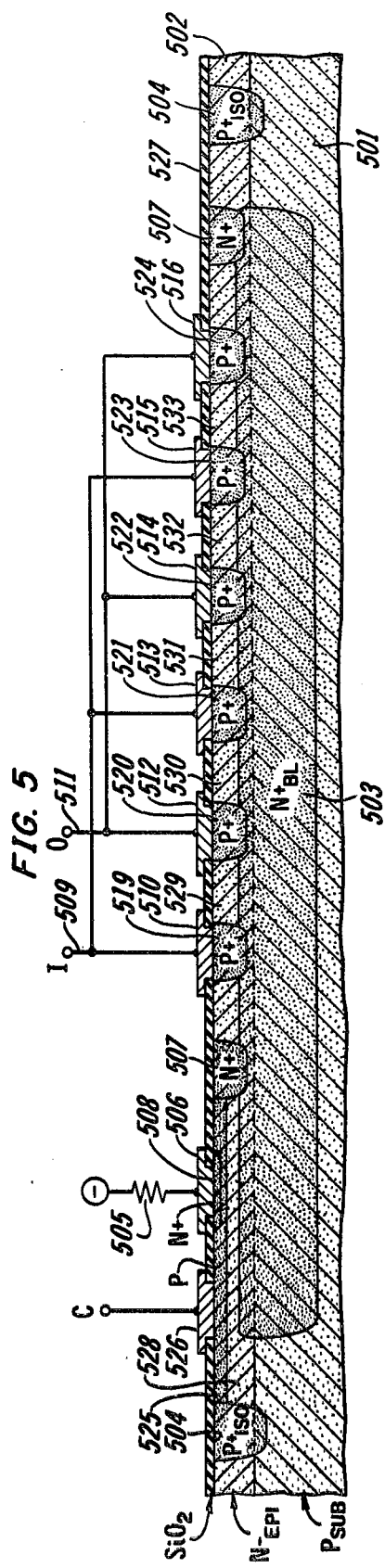
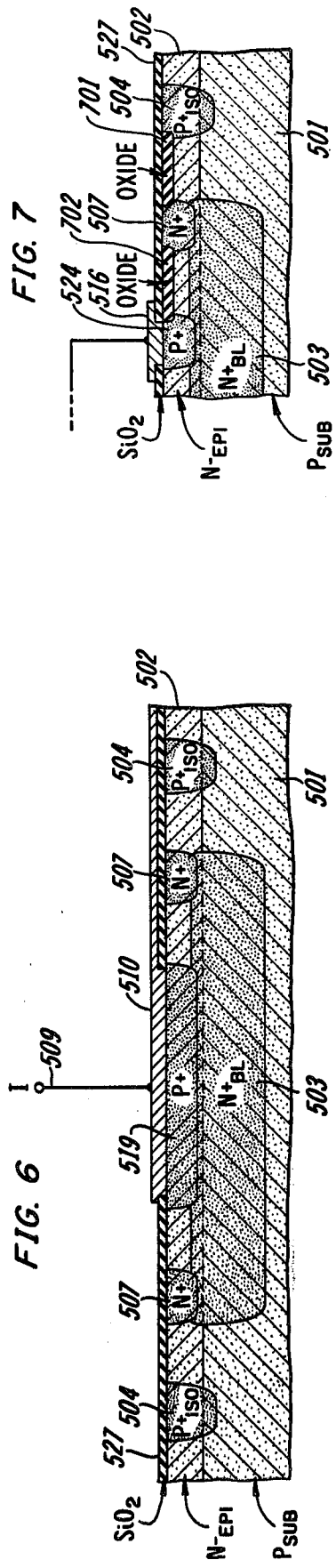

INTEGRATED SEMICONDUCTOR CROSSPOINT ARRANGEMENT

FIELD OF THE INVENTION

This invention relates to analog switching circuit arrangements for bipolar signals and more particularly to a crosspoint comprising a symmetrical bilateral transmission transistor and associated drive circuitry.

BACKGROUND OF THE INVENTION

Bilateral analog transmission and switching circuits find wide application in voice communication systems. Historically, metallic crosspoints have been utilized in such applications since such crosspoints exhibit a high open circuit impedance and a low, bilateral closed circuit impedance. Additionally, the control circuitry for metallic crosspoints is isolated from the transmission paths. Gas tubes and various semiconductor devices have been utilized as replacements for metallic switching circuits, however, such replacement arrangements comprise asymmetrical devices which exhibit undesirable transmission or control characteristics.

SUMMARY OF THE INVENTION

In accordance with the present invention a high performance symmetrical bilateral PNP transmission switching transistor and an associated NPN drive transistor are formed in a epitaxial layer over a common n-type buried tub in a p-type substrate to form a crosspoint. Individual transmission transistors and their associated drive transistors are isolated by means of frame shaped p-type isolation regions lying outside the buried tub. The collector of the NPN drive transistor and the base of the PNP crosspoint are ohmically connected by means of the buried tub. The emitter and collector electrode regions of the transmission switching transistor are stripe shaped and are of equal size, shape, and doping density and are formed in a common processing step with the isolation region. The formation of emitter and collector electrode regions in a common processing step with an isolation region is disclosed in copending application, Fulton-Ooms-Reed application Ser. No. 781,788, filed Mar. 28, 1977 and assigned to Bell Telephone Laboratories, Incorporated.

Advantageously, since the PNP and NPN transistors are ohmically connected rather than sharing a common active region, the parameters of these transistors may be individually controlled in manufacture. Additionally, since the emitter and collector electrodes of the transmission transistor are identical in size, shape, and doping density, these transistors are electrically symmetrical and their operating characteristic is symmetrical and linear about the origin of the curve for signals of reasonable current magnitude.

In accordance with the present invention, a plurality of pairs of emitter and collector electrodes may be constructed in a single transmission transistor to provide higher current carrying capacity and higher efficiency. As viewed from the surface of the semiconductor body, the emitter and collector electrodes are interlaced and one surface metallization serves to interconnect the plurality of emitter electrodes and another surface metallization serves to interconnect the collector electrodes. Since the switching transistor is symmetrical, the emitter and collector electrodes are interchangeable; therefore, these electrodes are referred to as emitter/collector electrodes, herein.

Advantageously, transmission transistors constructed of more than one pair of emitter/collector electrodes tend to have higher efficiency since in each structure in accordance with the present invention, there are higher losses associated with the two-end emitter/collector electrodes.

BRIEF DESCRIPTION OF THE DRAWING

FIG. 5 is a cross section of a crosspoint comprising a plurality of pairs of emitter and collector electrodes with the optional deep oxide regions omitted;

FIG. 6 is an end cross section of a crosspoint of FIG. 5 rotated 90° from the cross section of FIG. 5; and FIG. 7 is a cross section showing a modification of FIG. 5 to include optional deep oxide regions.

DETAILED DESCRIPTION

Figure 1:
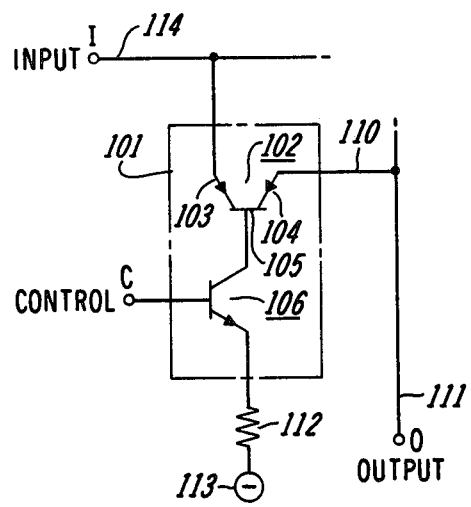
FIG. 1 is a schematic representation of a crosspoint/circuit of the present invention.

In FIG. 1 there is shown a crosspoint 101 comprising a symmetrical transmission switching transistor 102 which comprises a base 105 and emitter/collector electrodes 103, 104. The switched transmission path comprises: the input terminal I, the conductor 114, the electrode 103, the electrode 104, the conductors 110, 111, and the output terminal O. Since the transistor 102 has a symmetrical operating characteristic, the electrodes 103 and 104 can be interchangeably used as an emitter or a collector. Current for controlling the transistor 102 is provided by the negative current supply 113, the resistor 112, and the control transistor 106. As will be seen later herein, although the symmetrical transmission switching transistor 102 and the control transistor 106 are merged in a semiconductor body over a single buried tub, the parameters of these two transistors may be independently controlled in manufacture.

The current which is provided by the control transistor 106 to the base 105 of the transmission transistor 102, is returned to the negative power supply via external circuitry not shown but connected to one of the electrodes 103, 104. In the absence of drive current to the base 105 of the transistor 102, there is a high impedance between the input terminal I and the output terminal O, and in the presence of adequate drive current to the base 105, there is a low impedance path between the input I and the output O for bipolar signals of reasonable current amplitude. The transistor 102 which is physically symmetrical, exhibits a symmetrical voltage-current characteristic which is linear through the zero crossing of the characteristic and thus provides a good transmission path for switching bilateral, bipolar analog signals.

Figure 2:
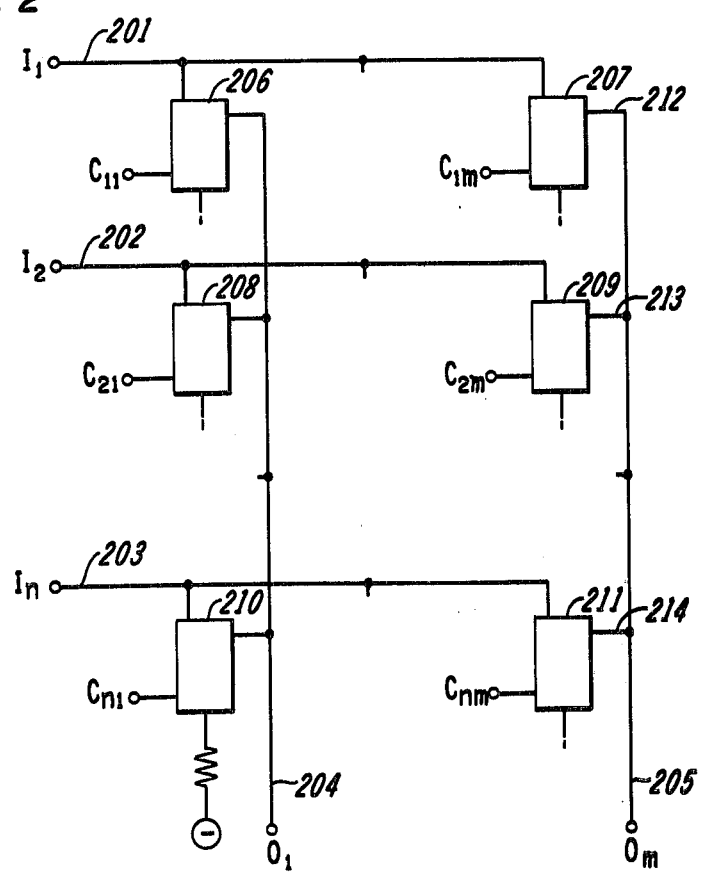
FIG. 2 shows a matrix of the circuits of FIG. 1.

The organization of a plurality of crosspoints in accordance with FIG. 1 is shown in the matrix of FIG. 2. Wherein the input lines $I_1$ through $I_n$, can be selectively connected to the output lines $O_1$ through $O_n$ by enabling the crosspoint at the intersection of the input and output lines to be interconnected. For example, if line $I_1$ is to be connected to line $O_1$ an enabling control signal is applied to terminal $C_{11}$ to enable crosspoint 206.

Figure 3:
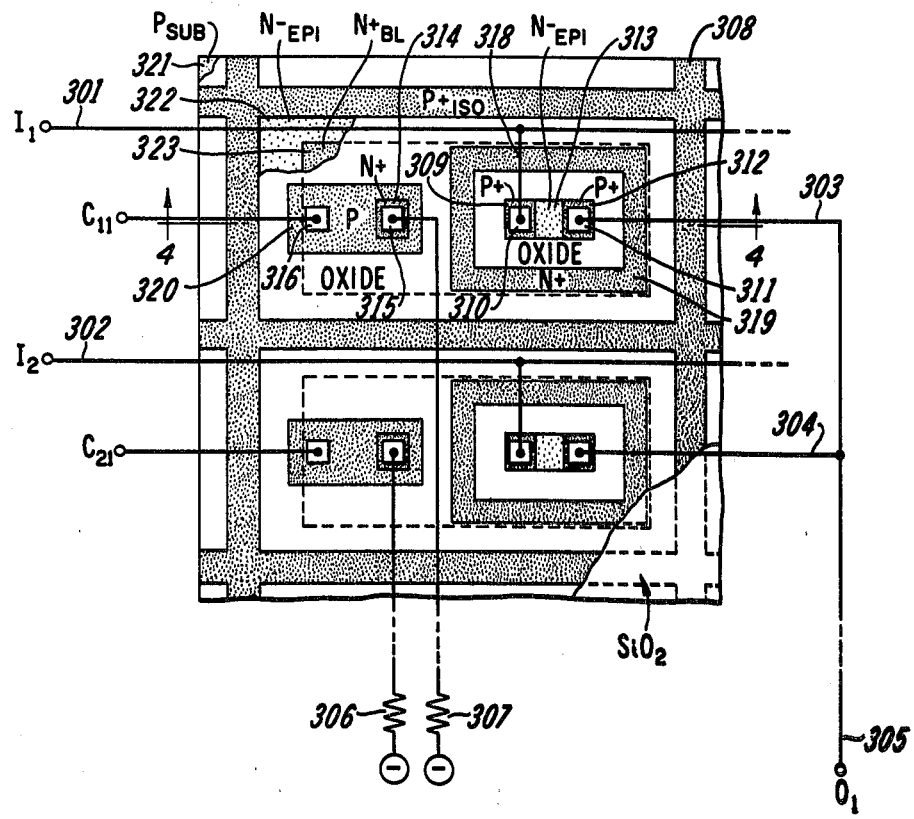
FIG. 3 is a plan view of two crosspoints constructed in accordance with the present invention including optional deep oxide regions.

In FIG. 3 there is shown in plan view two crosspoints such as represented in schematic form in FIG. 1. In the upper half of the plan view of FIG. 3, various layers of the structure are exposed while in the lower half a crosspoint is shown as viewed from the surface of the body. The crosspoints are isolated by the p+ isolation zone 308, which comprises a plurality of intersecting frame shaped structures. The isolation zone is shared by adjacent crosspoints. At the right side of FIG. 3 there are two equal sized stripe shaped p+ regions, 309 and 312, which are spaced apart and separated by a portion 313 of the epitaxial layer 322, which portion forms the base of the switching transistor. Surface metallizations 310 and 311 provide electrical access to the p+ regions 309 and 312, respectively. These p+ regions comprise emitter/collector electrodes of a transmission switching transistor, such as that shown schematically as transistor 102 in FIG. 1. This structure is formed in the integrated circuit body which comprises a p-type substrate 321 and an overlying epitaxial layer 322. An n+ buried layer 323 is formed within the p-type substrate and the structure is formed over that layer. The frame shaped n+ isolation region 319, which surrounds the electrodes 309 and 312, prevents injection from these electrodes to the substrate 321, the p+ isolation region 308, and the base region 320 of the vertical transistor.

The legends associated with the input and output lines correspond to those used in FIG. 2. Accordingly, the crosspoint shown in plan view in the upper half of FIG. 3 corresponds to the crosspoint 206 in FIG. 2 and the crosspoint shown in the lower half of FIG. 3 corresponds to the crosspoint 208 of FIG. 2. Power to these crosspoints is provided by the negative supplies shown at the bottom of FIG. 3 and the current source resistors 306 and 307. An enabling signal on the control conductor $C_{11}$ serves to interconnect the terminal $I_1$ to the terminal $O_1$ via the conductor 302, the transmission switching transistor shown in the upper half of FIG. 3 and the conductor 305. Similarly, an enabling signal on $C_{21}$ serves to interconnect the input terminal $I_2$ to the output terminal $O_1$ in a like manner but through the transmission switching transistor shown in the lower half of FIG. 3.

Figure 4:
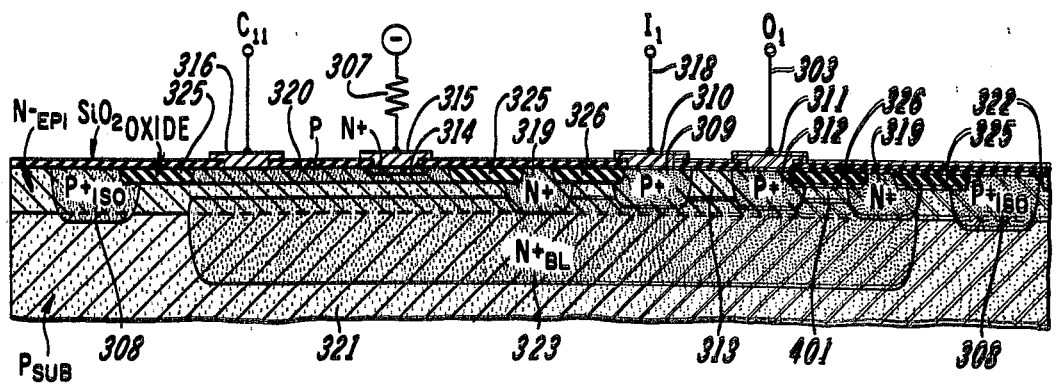
FIG. 4 is a cross section of a crosspoint of FIG. 3 as seen along the line 4—4.

In FIG. 4 there is shown a cross section of the crosspoint shown in the upper half of FIG. 3 as taken along the line 4—4. The crosspoint is formed in the semiconductor body which comprises the substrate 321 and the epitaxial layer 322. The n+ buried layer 323 is formed in the substrate 321 prior to growth of the epitaxial layer 322. The p+ electrode regions 309, 312 of the switching transistor and the frame shaped p-type isolation region 308 are formed in a common processing step. Accordingly, the doping levels of these regions are comparable. The n+ frame isolation shaped region 319 is formed in a further processing step, as are the base region 320 and the emitter region 314 formed in further processing steps. As explained above herein, the n+ isolation region 319, which intersects the n+ buried layer 323, serves to prevent injection from the electrode regions 309 and 312 to nearby p-type regions, namely, isolation region 308, the substrate 321, and the base region 320. The optional deep oxide regions 326 and 325 respectively isolate the n+ isolation region 319 from the p+ electrodes 309 and 312 and from the isolation region 308 and the base region 320. These deep oxide regions serve to increase the breakdown potential between the respective adjacent regions, to reduce undesirable inter-element capacitance, and reduce undesired electrode emissions in directions away from collector electrodes. The structure of FIGS. 3 and 4 comprises two emitter/collector electrode regions 309, 312, and as seen in these figures, each of these electrodes is spaced apart from the n+ isolation region 319, however, each of these regions is adjacent to a portion of the epitaxial layer, e.g., 321 of FIG. 4. In this physical relationship there is a parasitic diode comprising, e.g., the p-type electrode region 312 and the n-type epitaxial layer region 313. As will be seen with respect to the discussion of FIG. 5 below herein, a structure which comprises a plurality of pairs of emitter/collector regions tends to have a higher efficiency than a device having a single pair of emitter/collector electrodes.

The crosspoint structure of FIG. 5 corresponds substantially to the structure of FIGS. 3 and 4 with the exception that in FIG. 5 there are six emitter/collector regions 519 through 524, arranged in two interlaced sets which form the input and output electrode regions. Additionally, in FIG. 5 the optional deep oxide regions are omitted. The regions 519 through 524 have respectively associated therewith the metallizations 510 through 516. The metallizations 510, 513, and 515 are interconnected by further surface metallization to the input terminal I via the conductor 509; and the metallizations 512, 514, and 516 are interconnected by further surface metallization; and the conductor 511 to the output terminal O. Although not shown in the drawing, metallization interconnecting the electrodes 510, 513, and 515 is on the surface along one side of the electrodes 519 through 524, while the metallizations interconnecting 512, 514, and 516 lies on the other side of the regions 519 through 524. As seen in FIG. 3, three sides of each of the electrode regions 309 and 312 are laterally exposed to the n+ connecting regions 319. Similarly, in FIG. 5, the end regions 519 and 524 are exposed to the n+ regions on three sides. In contrast, the other electrode regions intermediate the end regions, such as the electrode regions 520 through 523, have only two sides laterally exposed to the n+ connecting region. Accordingly, the parasitic PN junctions associated with the interior electrodes 520 through 523 are of less electrical significance than those associated with the end electrodes 520 through 524. Accordingly, transmission switching transistors having a plurality of pairs of emitter/collector electrodes tend to have a slightly higher efficiency than a transmission switching transistor having only a single pair of emitter/collector electrodes.

The vertical NPN transistor of FIG. 5 comprises the n-type emitter region 508, the p-type base region 525, and the n-type collector region comprising a portion 528 of the epitaxial layer. The active portion of the collector region 528 is ohmically connected to the base regions 529 through 533 of the switching transistor by the n+ buried layer 503. The crosspoint of FIG. 5 is isolated by a frame shaped p+ isolation region 504. As in the case of the structures in FIGS. 3 and 4, the p+ electrode regions 519 through 524 and the isolation region 504 are formed in a common processing step. The p+ regions 519 through 524 are each stripe shaped of equal size, shape, and doping level and are spaced apart an equal distance from one and another. Accordingly, in the structures of FIGS. 3 and 5 the devices exhibit symmetrical electrical characteristics and in FIG. 5 the interconnected electrode regions 519, 521, and 523, as well as the interconnected regions 520, 522, and 524, may be used as emitters or collectors without distinction.

In FIG. 7 there is shown a portion of a structure which corresponds to that shown to the right side of FIG. 5 with added deep oxide regions 701 and 702. As explained with respect to FIGS. 3 and 4, the optional deep oxide regions are utilized to isolate the n+ isolation region 507 so as to decrease inter-element capacitance and to increase inter-element breakdown voltage.

FIG. 6 is a cross section as taken through p+ electrode region 519 rotated 90° from the cross section of FIG. 5. The elements shown in FIG. 6 are labeled in accordance with the labels of FIG. 5. Where optional deep oxide regions, e.g., 701 and 702 are utilized, such oxide regions would appear in the cross section of FIG. 6 between the n+ connection region 507 and the p+ electrode region 519 and the p+ isolation region 504.

In summary, each of the structures shown in accordance with the present invention comprises a transmission switching transistor having pairs of identical stripe shaped emitter/collector electrode regions spaced apart laterally in an epitaxial layer to provide symmetrical electrical characteristics such that a crosspoint may be utilized as a bilateral analog transmission switching element for bipolar signals. Additionally, each crosspoint comprises a vertical NPN control transistor having its collector region ohmically connected to the base of the switching transistor. Advantageously, this configuration permits independent control of the parameter of the lateral PNP transistor and the vertical NPN transistor in manufacture.

What is claimed is:

1. A semiconductor structure formed in a body comprising a substrate of one conductivity type and a relatively lightly doped epitaxial layer of the opposite conductivity type formed thereon, the structure comprising:
   a relatively highly doped buried tub of said opposite conductivity type formed in said substrate, a relatively highly doped first frame shaped isolation region of said opposite conductivity type extending from the exposed surface of said epitaxial layer to said buried tub, a relatively highly doped second frame shaped isolation region of said one conductivity type spaced apart from and encircling said first frame shaped region and extending from said exposed surface of said epitaxial layer substantially to said substrate outside of said buried tub;
   at least one pair of relatively highly doped, equal sized, stripe shaped electrode regions of said one conductivity type overlying said buried tub, whereby said electrode regions extend from said exposed surface of said epitaxial layer to said buried tub;
   means at the exposed surface of said epitaxial layer for electrically connecting individually to the electrode regions of each of said pairs and means for electrically interconnecting corresponding electrodes of said pairs to one and another; and
   a control region of said one conductivity type shallower than said second isolation region formed laterally outside said first frame shaped isolation region but overlying said buried tub, a source region of said opposite conductivity type formed within said control region,
   means at the exposed surface of said control region for providing electrical access thereto, and means at the exposed surface of said source region for electrically contacting thereto.

2. A semiconductor structure in accordance with claim 1 further comprising a first oxide region extending from the exposed surface of said epitaxial layer towards said substrate and interposed laterally between said second from shaped isolation region and said first frame shaped isolation region and a further oxide region extending from the exposed surface of said epitaxial layer extending towards said substrate and interposed laterally between said first frame shaped isolation region and said electrode regions.

3. A semiconductor structure formed in a body comprising a p-type substrate and a uniform n− epitaxial layer formed thereon, the structure comprising:
   a buried n+ tub formed in said substrate, a frame shaped n+ isolation region extending from the exposed surface of said epitaxial layer to said buried tub, a p+ frame shaped isolation region spaced apart from said n+ isolation region and extending from said exposed surface of said epitaxial layer to said substrate outside of said buried tub;
   at least one pair of p+ spaced apart electrode regions of substantially identical size and shape overlying said buried tub, said electrode region extending from said exposed surface of said epitaxial layer to said buried tub and formed in the same processing step with said p+ isolation region, means at the exposed surface of said epitaxial layer for electrically contacting individually to said electrode regions of each of said pairs and means for electrically connecting corresponding electrodes of said pairs to one another; and
   a p-type control region shallower than said p+ isolation region formed outside said frame shaped n+ isolation region, but overlying said n+ buried tub, means at the exposed surface of said p-type control region for providing electrical access thereto, an n-type source region formed within said control region and extending from said exposed surface into said control region, and means at the exposed surface of said epitaxial layer for electrically contacting said n-type source region.

4. A semiconductor structure in accordance with claim 3 further comprising a first oxide region extending from the exposed surface of said epitaxial layer toward said substrate and interposed laterally between said n+ isolation region and said p+ isolation region and a second oxide region extending from said expose surface to said epitaxial layer toward said substrate and interposed laterally between said n+ isolation and said electrode region.

5. In a semiconductor body comprising a substrate of one conductivity type and an epitaxial layer of the opposite conductivity type overlying said substrate, an integrated circuit structure of a plurality of crosspoints constructed in a matrix of rows and columns, said crosspoints constructed within frame shaped regions defined by intersecting rows and columns of isolation regions of said one conductivity type extending inwardly from the exposed surface of said body, said frame shaped regions laterally encircling buried tubs in said substrate within each of said frame shaped regions;
   each one of said crosspoints formed within one of said frame shaped regions comprises a symmetrical lateral transmission switching transistor comprising at least first and second stripe shaped electrode regions of said one conductivity type extending inwardly from the exposed surface of said body and formed in the same processing step as said isolation regions, a first base region of said opposite conductivity type surrounding said electrode regions and ohmically connected to the buried tub encircled by said one of said frame shaped regions, means for electrically accessing said electrode regions;

a vertical control transistor overlying the same buried tub as said transmission switching transistor comprising at least a second base region of said one conductivity type extending inwardly from the exposed surface of said body, an emitter region of said opposite conductivity type extending from the exposed surface of said body and formed within said second base region, a collector region of said opposite conductivity type surrounding said second base region and ohmically connected to said buried tub whereby said collector region of said control transistor is ohmically connected to said first base region of said transmission and switching transistor; and means at the exposed surface of said body for electrically interconnecting said first electrode region of each transmission switching transistor of a row and further means for electrically inteconnecting said second electrode region of each switching transistor of a column.

* * * * *